United States Patent [19]
Hopfer

[11] Patent Number: 5,282,111
[45] Date of Patent: Jan. 25, 1994

[54] THERMAL TRANSFER PLATE AND INTEGRATED CIRCUIT CHIP OR OTHER ELECTRICAL COMPONENT ASSEMBLIES INCLUDING SUCH PLATE

[75] Inventor: Albert N. Hopfer, Park Ridge, Ill.

[73] Assignee: Labinal Components and Systems, Inc., Elk Grove Village, Ill.

[21] Appl. No.: 871,586

[22] Filed: Apr. 20, 1992

Related U.S. Application Data

[63] Continuation of Ser. No. 499,025, Mar. 26, 1990, abandoned, which is a continuation-in-part of Ser. No. 364,343, Jun. 9, 1989, abandoned.

[51] Int. Cl.[5] .............................................. H05K 7/20
[52] U.S. Cl. .................................... 361/704; 174/16.3; 165/185; 439/485; 439/487; 361/707; 361/785
[58] Field of Search ................................. 361/386–389, 361/383, 413; 439/73, 485, 487; 174/16.3, 52.4; 165/80.3, 185

[56] References Cited

U.S. PATENT DOCUMENTS

| 3,195,628 | 11/1961 | McAdam . | |
|---|---|---|---|
| 3,917,375 | 11/1975 | Johnson . | |
| 4,082,407 | 4/1978 | Smorzaniuk et al. | 439/487 |
| 4,092,697 | 5/1978 | Spaight . | |
| 4,190,098 | 2/1980 | Hanlon . | |
| 4,508,405 | 4/1985 | Damon . | |
| 4,539,621 | 3/1985 | Currier | 439/487 |
| 4,595,794 | 6/1986 | Wasserman . | |
| 4,679,118 | 7/1987 | Johnson et al. | 439/487 |
| 4,682,269 | 7/1987 | Pitasi . | |
| 4,716,494 | 12/1987 | Bright et al. . | |
| 4,731,698 | 3/1988 | Millot et al. | 439/485 |
| 4,750,092 | 6/1988 | Werther . | |
| 4,803,546 | 2/1989 | Sugimoto et al. . | |

FOREIGN PATENT DOCUMENTS 005376 5/1983 European Pat. Off. .
0143262 6/1985 European Pat. Off. .
2163287 2/1986 United Kingdom .

OTHER PUBLICATIONS

Franck et al, "Microcircuit Module And Connector", IBM Tech Disclosure Bulletin, vol. 13, No. 7, Dec. 1970 pp. 1786–1787.
IBM Technical Disclosure Bulletin, p. 58, vol. 13, No. 1, Jun. 1970, "Integrated Circuit Package and Heat Sink".
Cho-Therm Thermal Interface Materials products catalog, pp. 1–3, 8–14.
SMART II Proceedings, Surface Mounting and Reflow Technology Conference, Jan. 1986, pp. 23–37.
EG&G Wakefield Engineering, heat dissipation components product catalog, pp. 1, 24–34, 94–97, 100–102.

Primary Examiner—Gregory D. Thompson
Attorney, Agent, or Firm—Leydig, Voit & Mayer, Ltd.

[57] ABSTRACT

A thermal transfer plate for removing heat to a heat sink or cooling fins positioned between an electrical component and a mounting surface. The plate comprises a heat conductive material which is in thermal communication with the electrical component and extends beyond the electrical component to establish thermal communication with a heat sink or cooling fins. In one specific embodiment, the thermal transfer plate has a base portion with upright side walls which form a socket to receive the electrical component. Horizontal cooling fins are located at the top of the sidewalls. The cooling fins can be of any shape which will perform the cooling or heat sink function and can be made with openings which permit air to circulate through the cooling fins. Moreover, due to its efficient heat transfer capabilities, the thermal transfer plate could be thermally connected to a separate heat sink device.

51 Claims, 6 Drawing Sheets

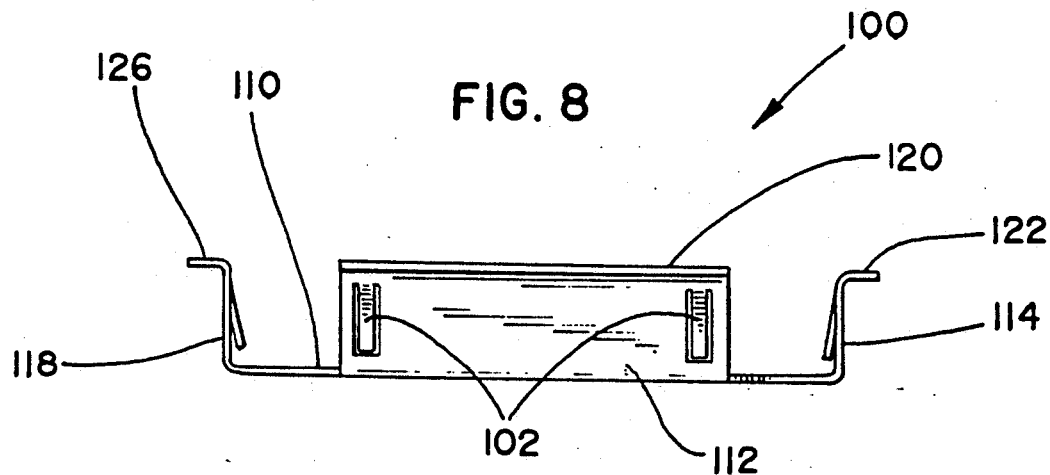
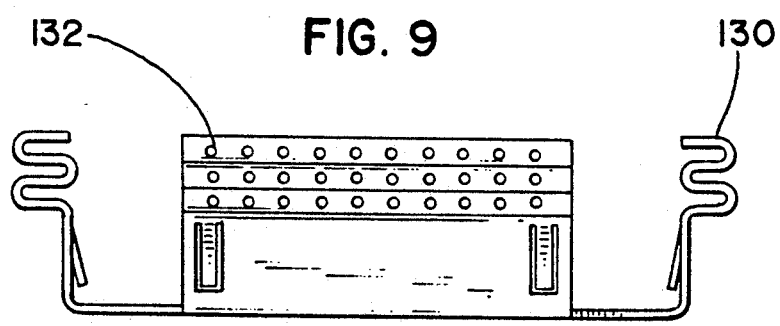
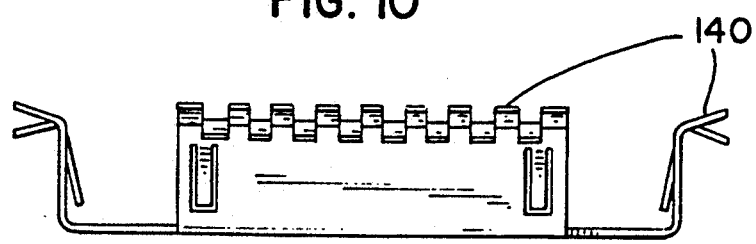

THERMAL TRANSFER PLATE AND INTEGRATED CIRCUIT CHIP OR OTHER ELECTRICAL COMPONENT ASSEMBLIES INCLUDING SUCH PLATE

RELATED CASE

This application is a continuation of application Ser. No. 07/499,025, filed Mar. 26, 1990, now abandoned, which is a continuation in part of copending application Ser. No. 07/364,343, filed Jun. 9, 1989 by Arun J. Shah, David W. McClung, Albert N. Hopfer, Richard J. Lindeman, and Saeed Zafar, now abandoned. Application Ser. No. 07/754,261, filed Aug. 28, 1991, now U.S. Pat. No. 5,127,837, is hereby incorporated herein by reference.

FIELD OF THE INVENTION

This invention relates to removing unwanted heat from an integrated circuit chip or other electrical components, and more particularly pertains to a thermal transfer plate for an integrated circuit chip socket or an electrical component socket.

BACKGROUND OF THE INVENTION

Integrated circuit ("IC") chips contain a variety of miniaturized electronic circuitry and are widely used on printed circuit boards manufactured by the electronics industry to form composite electrical circuits. A typical IC chip or die is located within a ceramic substrate and is the actual electronic circuitry that is coupled to leads that extend to contacts or terminals positioned about the perimeter of the substrate or in various patterns across the bottom surface such as land grid arrays. This assembly is referred to as an IC package or a chip carrier. During operation of the electronic circuitry, the die generates heat and this heat can destroy the active elements in the die. In addition, heat can severely limit the speed and power capabilities of the circuitry of an IC chip. Therefore, it is necessary to dissipate the heat generated by the die in the IC chip.

One means of dissipating the heat generated by the IC chip is the use of a heat sink. For example, the heat sink or radiating member can be integrated into the top of the IC package to radiate heat from the top of the IC package, as shown in Spaight U.S. Pat. No. 4,092,697, Sugimoto et al. U.S. Pat. No. 4,803,546, and Werther U.S. Pat. No. 4,750,092. In another example of heat dissipation, thermal conducting elements are used to transmit heat to a heat sink which is mounted on a printed circuit ("PC") board on the side which is opposite to the IC package, as shown in Pitasi U.S. Pat. No. 4,682,269 and IBM Technical Disclosure Bulletin Vol. 13 No. 1, June 1970 at page 58. In yet another example of heat dissipation, a removable heat sink is attached to the upper surface of an IC package, as shown in Bright et al. U.S. Pat. No. 4,716,494.

These methods could be used with IC packages which direct the thermal flow upward, i.e., away from the PC board. In these IC packages, the thermal transfer and the electrical contacts are located on opposing surfaces of the IC package. These IC packages use a "cavity down" configuration and incorporate a copper/tungsten slug into the cavity. The die is mounted directly onto the copper/tungsten slug and a silver glass paste is used to attach the die to the slug in order to minimize voiding. The die and slug are attached to the upper portion of the IC package. The heat generated by the die is conducted to the slug which then dissipates the heat to the air above and surrounding the IC package. Thus, these IC packages direct the thermal flow upward, i.e., away from the PC board or socket.

However, these prior art heat sinking methods are not suitable for IC packages which direct the thermal flow downward, i.e., toward the PC board or into the socket. In these IC packages, the thermal transfer area and electrical contacts are located on the same surface. These IC packages use a "cavity up" configuration and also incorporate a metal slug into the cavity to dissipate the heat from the die. However, in the cavity up configuration, the metal slug is attached to the lower portion of the IC package, i.e., the mounting side of the IC package. In addition, the metal slug can incorporate posts or a plate. The ceramic substrate, which forms the exterior of the IC package, is molded around the posts or plate so that the ends of the posts or the bottom surface of the plate protrude through the ceramic material to form thermal lands or pads. Consequently, in the cavity up configuration, the thermal flow is directed downward, i.e., toward the PC board or into the socket.

This cavity up configuration permits a higher density of inputs and outputs ("I/O") to the die and also reduces the length of the traces which connect the I/O's on the die to the pads or lands on the bottom of the IC package. The shorter traces result in faster signal speeds since the signal travels a shorter distance along the trace.

Furthermore, other methods for dissipating heat from IC packages which use a cavity up configuration have disadvantages. For example, if the thermal path between the IC package and the PC board is completed by soldering, the heat transfer is compromised because solder is a poor thermal coupler. In addition, solder joints are less reliable in a large array area captured under the IC package and soldering would increase the manufacturing costs. Another alternative would be to use a heat sink which penetrates the PC board. However, such a heat sink would require relatively large thru-holes in the PC board and these thru-holes would waste vast areas of precious electrical real estate on the PC board.

Another alternative would be heat dissipation via a copper layer or layers on or embedded in the PC board. However, these copper layers are very thin which greatly reduces the thermal conduction. Another alternative would be heat dissipation via the low expansion planes. The low expansion planes are incorporated into multilayer PC boards to control the thermal expansion of the PC board. Conventional multilayer boards use copper-clad Invar as a low expansion plane. However, low expansion planes are expensive and would increase the manufacturing cost. In addition, the low expansion planes eliminate areas where traces can be used on the PC board and results in wasted areas of potential electrical real estate. Therefore, a new means to dissipate heat from an electrical component was necessary.

Furthermore, IC packages are either soldered to the PC board or mounted into sockets or socket cavities which are attached to the PC board. The sockets are electrically attached to the PC board at the position designated for the IC package. The IC package is then inserted into the IC socket or socket cavity. The sockets are advantageous because a faulty IC package can be replaced with an operable IC package without the need to unsolder the faulty IC package and solder an operable IC package. Therefore, the socket saves time and expense in replacing a faulty IC package.

Accordingly, it is the object of this invention to provide a means to dissipate heat from an IC package or other electrical component which meets the aforementioned requirements and solves the aforementioned problems.

Another object of this invention is to provide a means to dissipate heat from an IC package or other electrical component which is mounted in a socket.

An additional object of this invention is to provide a means to dissipate heat from an electrical component located in a socket whereby the invention can include cooling fins or the invention can transfer the heat to a heat sink.

A further object of this invention is to provide a means to dissipate heat from an electrical component which directs the thermal flow downward into the socket or socket cavity.

Another object of the invention is to provide an additional means to dissipate heat from an electrical component which primarily directs the thermal flow upward away from the socket or socket cavity.

Another object of this invention is to provide a means to dissipate heat from an IC package or electrical component which is inexpensive to manufacture, reliable in operation, and efficient in dissipating heat.

Other objects and advantages of the invention will become apparent upon reading the following detailed description and appended claims, and upon reference to the accompanying drawings.

SUMMARY OF THE INVENTION

The aforementioned requirements and objects are satisfied through the thermal transfer plate of this invention and assemblies including such plates. The IC package is inserted into the thermal transfer plate and the socket body. The IC package is centered in the socket body by a plurality of centering springs which are disposed about the periphery of the socket body. An overlying retention spring is interlocked to peripheral portions of the socket body. Electrical communication is established between the traces on the PC board and the electrical contacts of IC package by means of interconnecting compressible wire buttons mounted in a button board and electrically conductive plungers reciprocally mounted in the button sockets. The thermal transfer plate has an array of holes or openings which register with the array of plungers in the socket and the array of pads on the IC package for effecting electrical connection between the overlying pads of the IC package and the underlying PC board traces. However, electrical communication, between the traces on the PC board and the pads or pins of the IC package, can be established by any contact system.

The thermal transfer plate has a base portion with upright side walls which form a socket to receive the IC package. Horizontal cooling fins are located at the top of the sidewalls. The cooling fins extend above the socket assembly so that the cooling fins can dissipate the heat to the surrounding air. The cooling fins can be made into any shape which will perform the cooling or heat sink function. Furthermore, the cooling fins have openings which permit air to circulate through the cooling fins.

Moreover, due to its efficient heat transfer capabilities, the thermal transfer plate could be thermally connected to a separate heat sink device. In this configuration, the thermal transfer plate would act as a conduit to transfer heat from the IC package or electrical component to the heat sink device.

A thermal interface material is located between the IC package and the thermal transfer plate. The thermal interface material improves the transfer of heat from the IC package to the thermal transfer plate.

The thermal transfer plate operates in the following manner. During operation of the electronic circuitry, the die generates heat. The heat from the die is transferred to the copper/tungsten slug or other suitable material on which the die is located. The heat in the copper/tungsten slug and surrounding ceramic substrate must be dissipated to the air or a heat sink in order to cool the IC package.

In accordance with this invention, the heat from the copper/tungsten slug and surrounding ceramic substrate is transferred to the thermal transfer plate through the thermal interface material. The thermal transfer plate then transfers the heat to the cooling fins or to a heat sink device where the heat will be dissipated.

DESCRIPTION OF THE DRAWINGS

For a more complete understanding of this invention reference should now be had to the embodiments illustrated in greater detail in the accompanying drawings and described below by way of examples of the invention. In the drawings:

FIG. 8 is a side elevational view of the thermal transfer plate as shown in FIG. 7.

FIG. 9 is a side elevational view of a thermal transfer plate with an alternative embodiment of the cooling fins.

FIG. 10 is a side elevational view of a thermal transfer plate with another alternative embodiment of the cooling fins.

It should be understood that the drawings are not necessarily to scale and that an embodiment is sometimes illustrated in part by schematic and fragmentary views. Furthermore, it should be understood, of course, that the invention is not necessarily limited to the particular embodiments illustrated herein.

DESCRIPTION OF THE INVENTION

Figure 1:
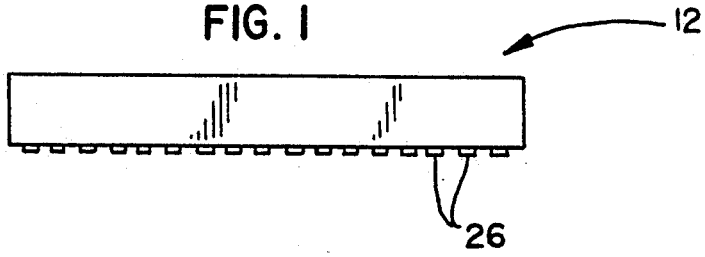
FIG. 1 is a side elevational view of an IC package which has a land grid array.
Figure 2:
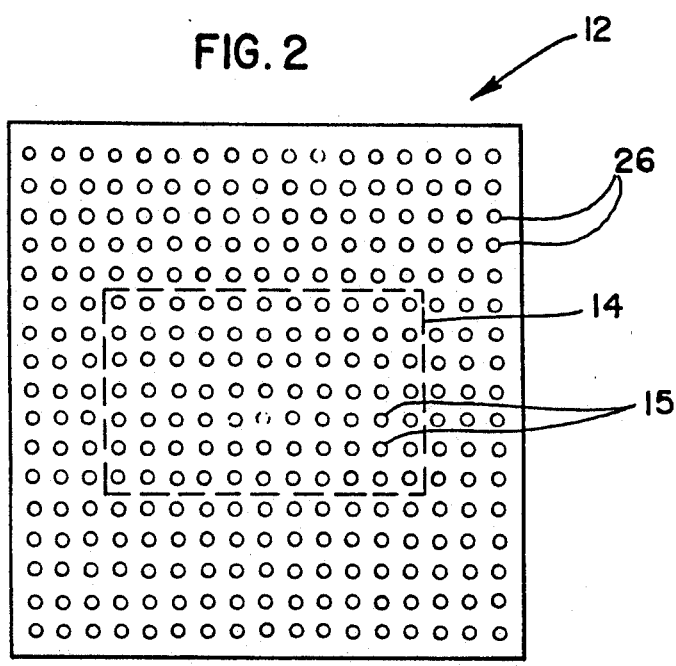
FIG. 2 is a bottom view of an IC package which has a land grid array.

Referring to FIGS. 1 and 2, an IC package, also known as an IC chip or chip carrier is indicated generally by the reference numeral 12. As noted above, the IC package contains a die which is not shown because it is concealed within the IC package. The die may contain thousands of microscopic electrical circuit elements. The input/output leads for the various circuits are connected to electrical contacts 26, also known as pads or lands, normally disposed about the periphery of the IC package 12. The electrical contacts 26 form a pattern which is known as a land grid array ("LGA"). This IC package uses a "cavity up" configuration which causes the thermal transfer area or center portion 14 (indicated by the dashed lines) to be located on the bottom of the IC package 12. The thermal transfer area 14 corresponds to the area directly below the die. As noted above, the die is attached to a metal slug which has posts which project through the ceramic to form thermal lands or pads 15. Consequently, in the cavity up configuration, the thermal flow is directed downward, i.e., toward the PC board. Thus, the thermal transfer area 14 and electrical contacts 26 are located on the same surface. While the majority of the heat generated by the die is directed to the thermal transfer area 14, such heat is also dissipated to other areas of the IC package.

Figure 3:
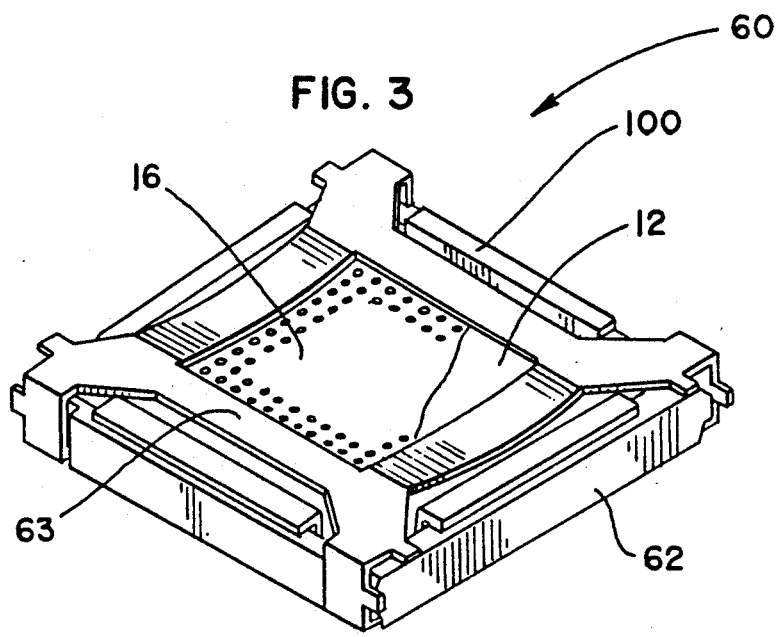
FIG. 3 is a three-dimensional view of a socket assembly employing a thermal transfer plate in accordance with this invention.
Figure 4:
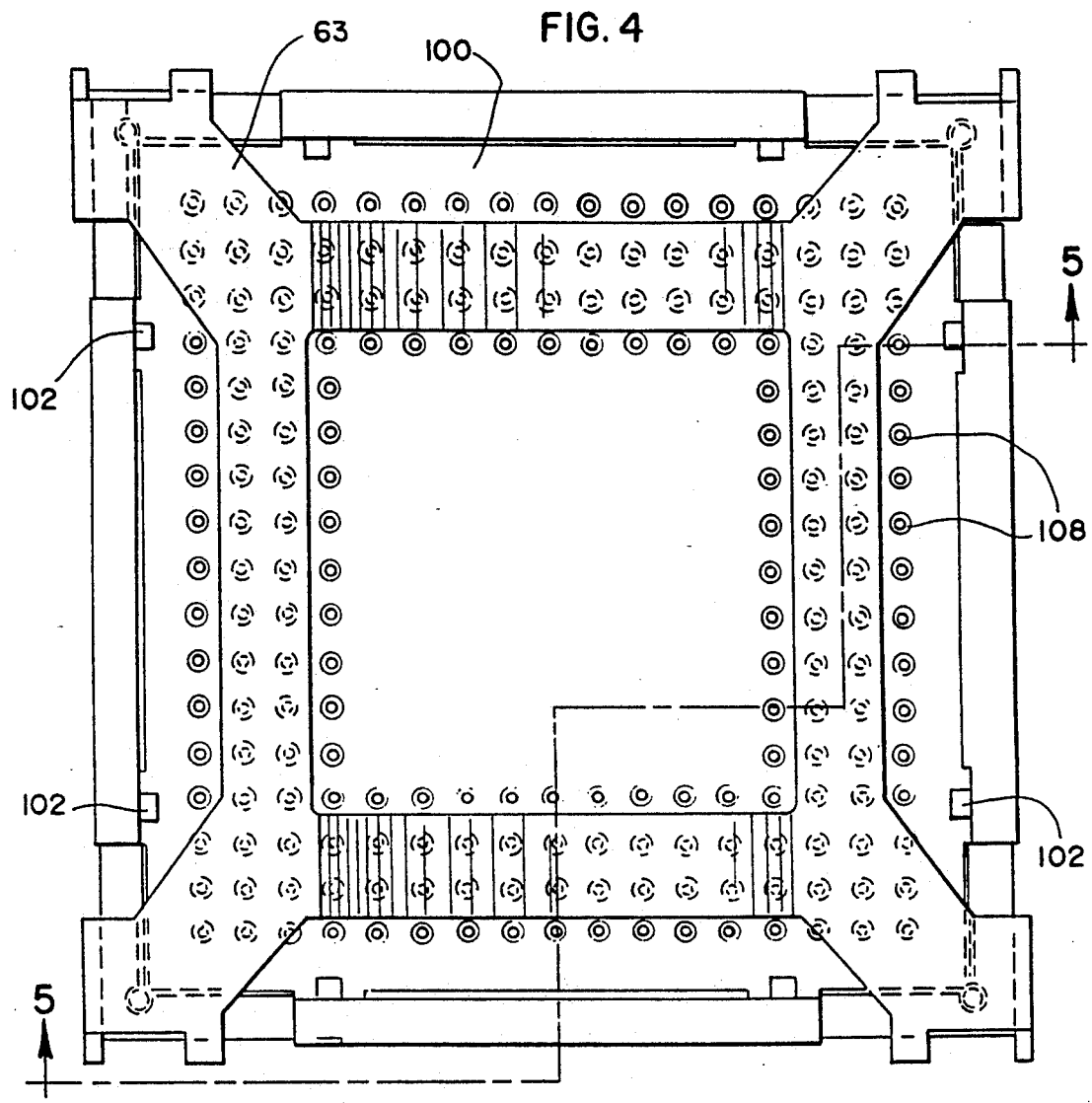
FIG. 4 is a top plan view of the socket assembly of FIG. 3.
Figure 5:
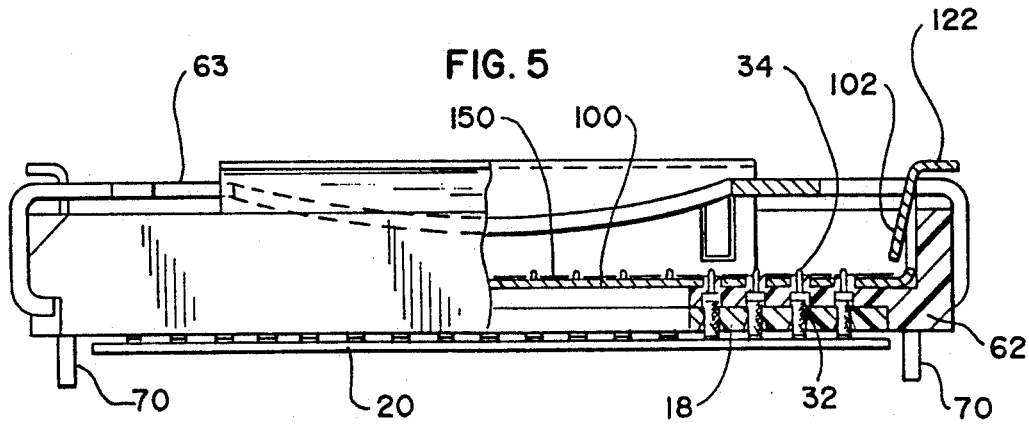
FIG. 5 is a sectional view taken on line 5—5 of FIG. 4.

The IC package 12 can be mounted into a socket assembly which is indicated generally as reference numeral 60 in FIG. 3. The socket assembly 60 provides for numerous conductive paths between a variety of PC board traces and the overlying electrical contacts 26. In particular, the assembly 60 includes a socket body 62 with plunger contacts 34 and a button board 18 with resilient buttons 32 for electrically interconnecting the lands 26 with traces 30 on a PC board 20. The IC package 12 (fragmentarily illustrated in FIG. 3) is disposed in a thermal transfer plate 100 which is seated in the socket body 62. The IC package 12 is centered in the socket body 62 by a plurality of centering tabs 102 which are disposed about the periphery of the socket body as shown in FIGS. 4 and 5. As shown in FIG. 8 the centering tabs 102 are integral with the thermal transfer plate 100. The centering tabs 102 are created by punching or striking a U-shaped portion of material from the side wall of the thermal transfer plate 100. The resulting tab is then bent inwards approximately 15 degrees from the vertical plane of the side wall. The number, shape and location of the centering tabs 102 could vary depending upon the needs of the particular device. In this particular embodiment, there are two simple leaf spring centering tabs 102 on each side of the thermal transfer plate 100 for a total of eight centering tabs.

The centering function of the centering tabs 102 could be achieved without striking material from the thermal transfer plate 100. For example, indentations 102A could be formed in the side walls of the thermal transfer plate 100 so that the indentations 102A protrude inward toward the IC package 12 as shown in FIG. 4. The number, location and size of the indentations would vary depending upon the particular device.

Figure 11:
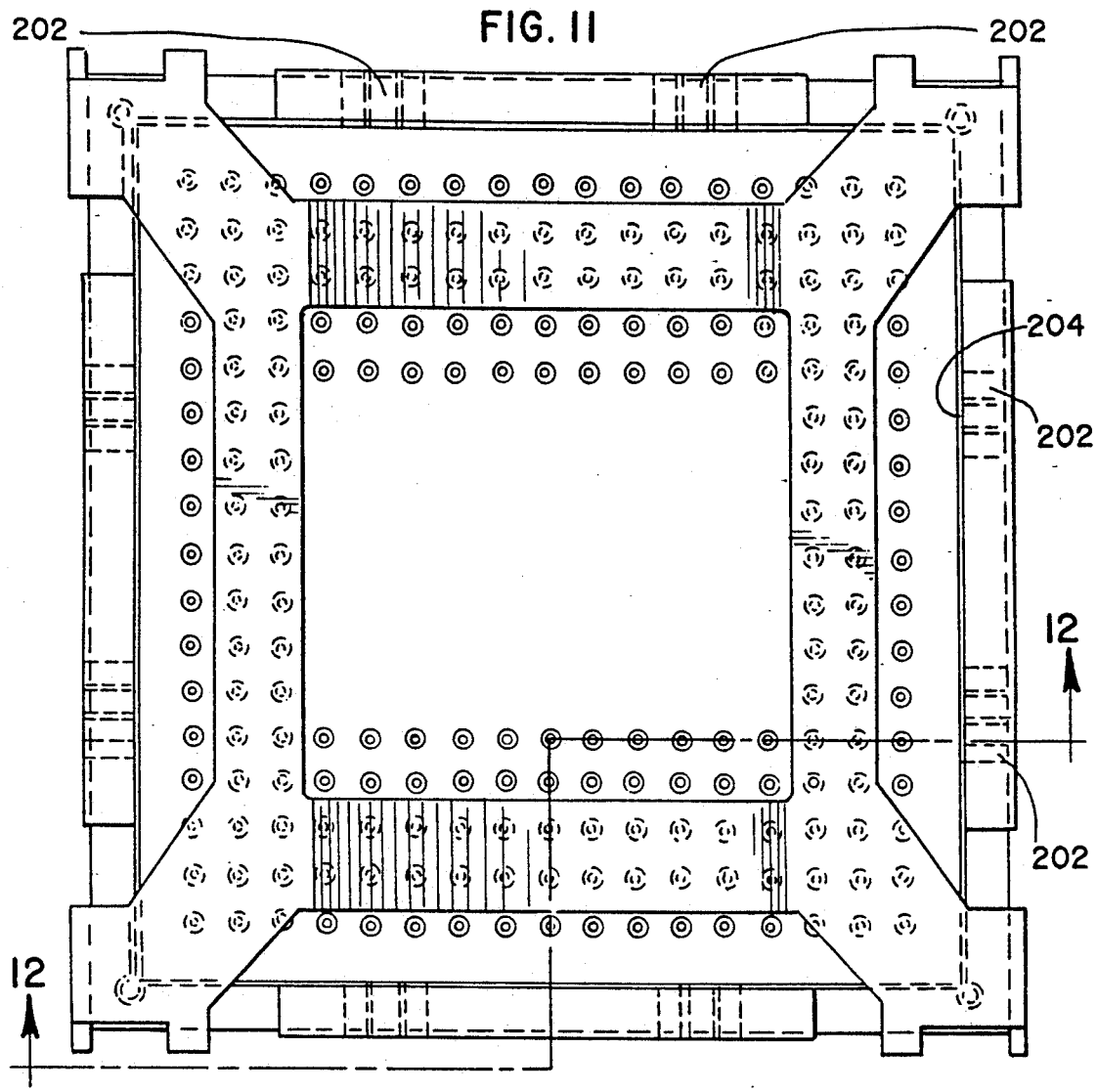
FIG. 11 is a plan view of a socket assembly with an alternative embodiment of the centering clips.
Figure 12:
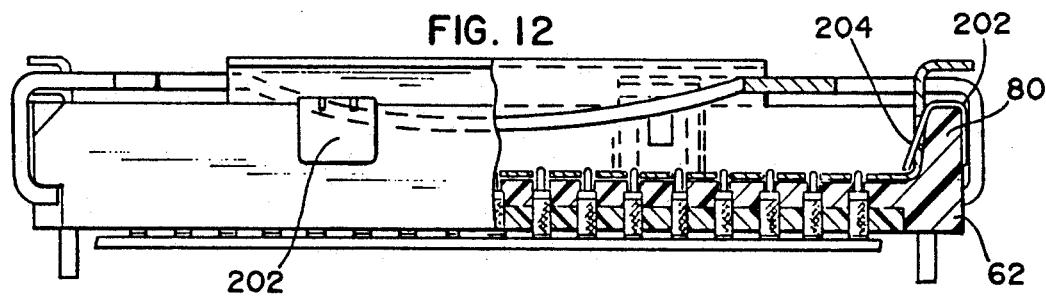
FIG. 12 is a sectional view taken on line 12—12 of FIG. 11.
Figure 13:
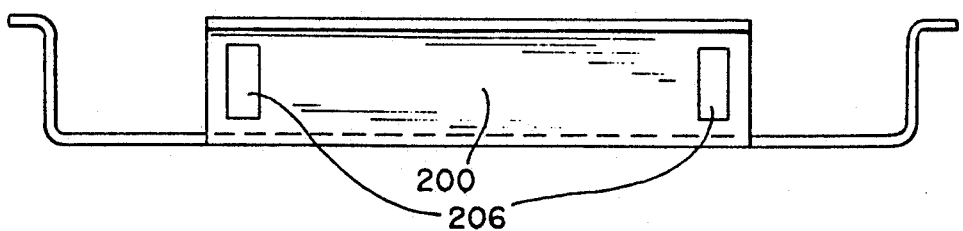
FIG. 13 is a side elevational view of the thermal transfer plate as shown in FIGS. 11 and 12.
Figure 15:
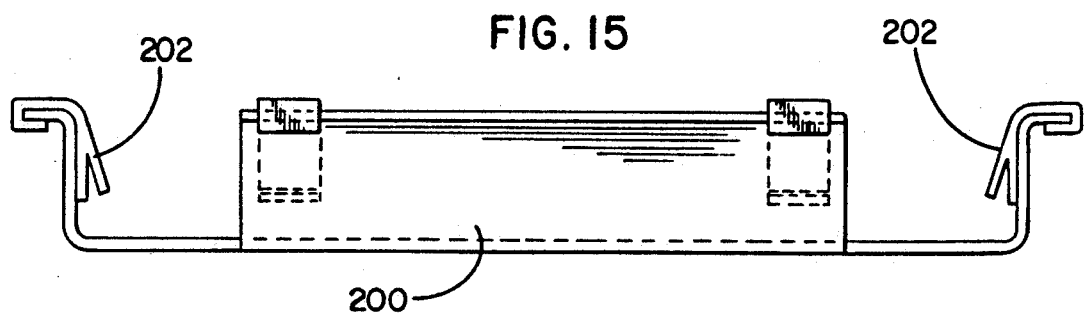
FIG. 15 is a side elevational view of yet another embodiment of the thermal transfer plate.

Alternatively, as shown in FIGS. 11 and 12, the centering tabs can be separate from the thermal transfer plate. In this particular embodiment, a plurality of centering tabs or clips 202 are disposed about the periphery of the socket body 62. The centering clips 202 are inverted U-shaped clips which are positioned over the side wall 80 of the socket body 62. The clips 202 are held in position by means of a friction fit between the opposed legs of the clip and the sidewall 80. A U-shaped section of material is struck from one of the legs and top portion of the centering clip and is bent inwards approximately 15 degrees from the vertical plane of the leg portion to form a spring tab 204. In order to accommodate the tab 204 on the centering clip 202, the thermal transfer plate 200 has rectangular openings 206, as shown in FIG. 13, and the tabs 204 can protrude through these openings 206 to center the IC package. Alternatively, the clips 202 can be attached to the thermal transfer plate 200 as shown in FIG. 15.

Figure 16:
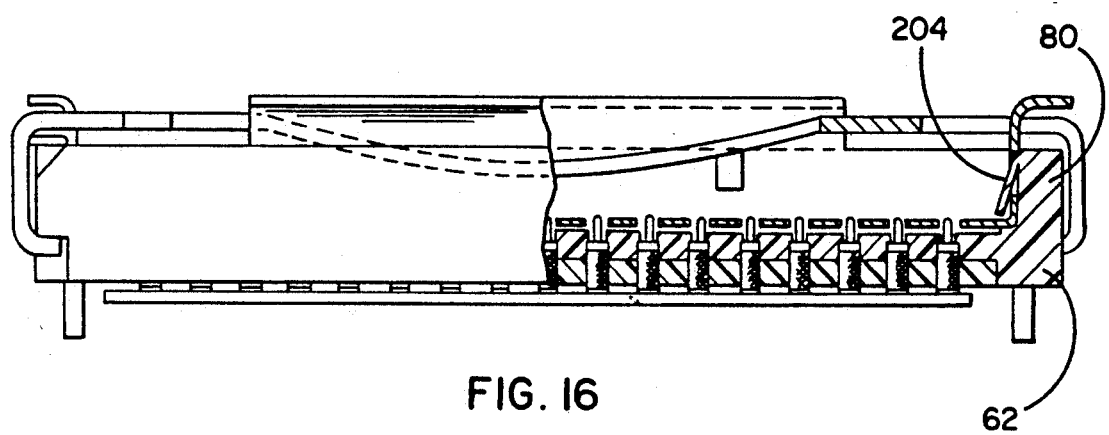
FIG. 16 is a sectional view similar to FIG. 12 of another embodiment of the thermal transfer plate.

Furthermore, the centering tabs could be incorporated into the sidewall 80 of the socket body 62. In this configuration, the centering tabs would protrude through the openings 206 to center the IC package as shown in FIG. 16.

Figure 6:
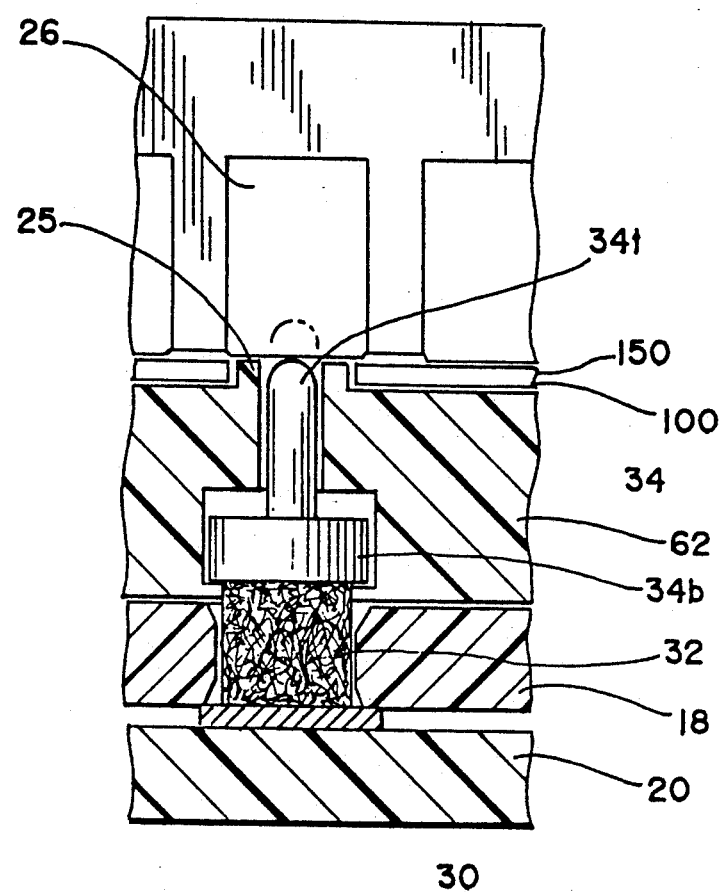
FIG. 6 is an enlarged sectional view illustrating the electrical paths in the socket assembly of FIGS. 3, 4 and 5 in the normal course of operation thereof.

After the IC package 12 is centered in the thermal transfer plate 100 and the socket body 62, an overlying retention spring 63 is interlocked to peripheral portions of the socket body 62, as illustrated in FIG. 3. The retention spring 63 urges the IC package 12 downwardly with a desired, predetermined biasing force against the distal terminal portions 34t of the underlying reciprocable plunger contacts 34 which abut subjacent resilient wadded wire buttons 32. As shown in FIG. 6, the plunger contacts 34 are depressed and the buttons 32 are compressed thereby upon insertion of the IC package 12 into the socket. Electrical communication thus is established between the respective traces 30 on the PC board and the corresponding electrical contacts 26 of IC package 12 by means of interconnecting resiliently compressible wadded wire buttons 32 mounted in the button board 18 and electrically conductive plunger contacts 34 reciprocally mounted in the socket body 62.

Use of conductive buttons 32 for purposes of effecting electrical connections is known in the art. Such buttons are preferably formed from a single strand of metal wire with each strand being wadded together to form a nearly cylindrical button. Each wadded wire button 32 is formed so as to fit within its receiving opening in the button board 18 as illustrated in FIG. 6 so as to be frictionally gripped thereby in the central area for retention of the button in the board but so as to not restrict the ability of at least its end portions to function as a resilient spring member.

It will be noted from FIG. 6 that in those board button combinations in which the buttons 32 project from a board surface, the button-receiving opening in such surface preferably is chamfered or enlarged. Such enlargement not only facilitates entry of a button if inserted from such surface but provides space assuring retention of each button within the limits of the board opening despite any button "mushrooming," off-center shifting of the button ends during compression or the presence of loosened strands at the button ends. During button compression and operation of the buttons, the traces 30 preferably abut against the board surfaces as illustrated in the drawings.

Also as illustrated in FIG. 6 a button board 18 may have a central button-engaging restriction portion R to retain the button along a central restricted annulus while allowing opposed elongate end portions of the buttons to freely compress and expand. Any button board opening design may be employed which allows desired resiliency of the buttons without gripping of the buttons so as to impair this necessary compression and expansion function. As a result, uniform button resilience and contacting is effected with resulting desired uniformity of conductivity.

The openings in the button board 18 of FIG. 6 may be formed by injection molding of appropriate insulating materials in dies of suitable configurations to provide the openings as the boards are molded. An example of suitable materials is polyphenylene sulfide such as sold by Phillips Petroleum Company under the tradename Ryton. Molding assures smooth aperture peripheries avoiding undesired button snagging or hangup. Fillers may be employed for strength enhancement. Button receiving openings may also be drilled in appropriate dielectric boards, and the chamfers may be formed by appropriate drilling or reaming of the aperture ends.

Each button 32 is so sized as to protrude slightly above and slightly below the button board 18 in which disposed. Each button 32 effects electrical contact at multiple points with trace 30 of board 20 at its cylindrical base and, at its opposed button end, effects similar electrical contact with the base of the respective plunger contact 34. Wadded wire button such as buttons 32 provide significant operational advantages not present in other types of connections such as soldered connections. The connections provided thereby are of high integrity and reliability and have very few associated variables which may affect the quality of the electrical connection. The only significant variables in contacts formed by buttons 32 are the size of the button itself and the compressive force which may be applied thereto in the course of effecting the interconnection between the opposed conductors of the connection in which the button comprises an intermediate element.

The buttons 32 are preferably formed from wire fabricated from copper alloys such as beryllium and copper, silver and copper, or copper-nickel-tin. It is apparent that when such buttons are placed under compression, they effect multiple contacts with the opposed contact areas providing multiple conductive paths. The wadded wire buttons are so formed they are substantially resilient so that when subjected to a compressive force, each button has a tendency to return to substantially its original shape. The wadded wire buttons 32 may be of the type marketed by the Cinch Division of Labinal Components and Systems, Inc., of Elk Grove Village, Ill., under the trademark CIN::APSE. Similar suitable buttons are available from other commercial sources.

In the normal course of use of the socket assembly 60, the IC package 12 is mounted in the recessed socket 16, the bottom of which comprises the thermal transfer plate 100 and the socket body 62 in which metallic plunger contacts 34 are mounted for reciprocal movement. Each plunger contact 34 may be formed of a durable electrically conductive metal, which is preferably coated with 200 micro inches of nickel and 100 micro inches of gold to enhance its durability. It is apparent in FIG. 6 that each plunger contact 34 has an enlarged cylindrical base portion 34b as well as an attached cylindrical bullet-shaped terminal portion 34t of lesser diameter having a rounded end to effect substantially a point contact with the engaged electrical contact 26.

Prior to insertion of the IC package 12, the upper plunger terminal portions 34t are in the dotted line position illustrated in FIG. 6 as a result of the uncompressed conditions of the wadded wire button 32. The uncompressed buttons 32 thus upwardly bias plunger contacts 34 toward a limit position where the upper surface portions of the base portions 34b strike the upper counterbore surfaces of the plunger recesses in which the plunger contacts 34 are disposed. Downward movement of the retention spring 63 forces the bottom of the electrical contacts 26 to downwardly move the plunger contacts 34, simultaneously compressing the underlying buttons 32 into the condition illustrated in FIG. 6. The latter compressed condition assures a desired low resistance, low inductance, high speed electrical connection between the bottom of each electrical contact 26 and its associated trace 30 of the printed circuit board 20.

By utilization of a two-piece intermediate connector comprising the button 32 and plunger contact 34 between the traces of the circuit board and the electrical contacts, desired uniform electrical communication is established between the board 20 and the IC package 12. The only contact effected between each plunger and an engaged electrical contact 26 is in the nature of a point contact under compression. The IC package 12 in the normal course of being located in the recess of the socket 16 may readily slidably move laterally relative to an engaged plunger terminal contact portion 34t without any damage whatsoever to its engaged, associated button 32.

The several connectors formed by the plunger contacts 34 and their respective associated buttons 32 are arranged in grid array for purposes of effecting desired interconnection between traces of a circuit board 20 and the bottoms of the buttons 32 as illustrated in FIG. 5. It will be noted from FIG. 5 that the buttons 32 may be detachably associated with socket body 62 for ready button replacement if and when necessary by a replaceable button board 18 which may interlock in a bottom recess of the socket body 62 by means of a press fit or equivalent means of detachable securement.

The socket assembly of FIG. 5 may be readily mounted to a printed circuit board by means of alignment and mounting posts 70. The posts may be received in a friction interference fit in corresponding mounting openings of such circuit boards such as circuit board 20.

As shown in FIGS. 4, 5 and 6, the thermal transfer plate 100 is located in the recessed socket 16 between the IC package 12 and the socket body 62. The thermal transfer plate 100 has an array of holes or openings 108 which correspond with the array of plunger contacts 34 in the socket and the array of electrical contacts 26 on the IC package with which those plunger contacts are to interconnect. Each plunger contact 34 is surrounded by a boss 25 which isolates the thermal transfer plate 100 from the plunger contact 34 so that the plunger contact 34 does not contact the thermal transfer plate 100. The openings 108 are slightly larger than the boss 25 which surrounds the distal end 34t of the plunger contacts 34. Consequently, each plunger contact 34 is able to move freely without restriction from the thermal transfer plate 100. The plunger contacts 34 are able to protrude through the openings 108 and electrically contact the electrical contacts 26 of the IC package. The openings 108 can be drilled or punched into the thermal transfer plate.

The thermal transfer plate 100 which is shown in FIG. 8 is made from ½ hard beryllium copper 17410.

The thermal transfer plate which is shown in FIG. 9 is made from ¼ hard copper CDA. However, other materials can be used, such as aluminum. The material used to manufacture the thermal transfer plate 100 may vary in thickness from 0.012 to 0.005 inches. However, the thickness of the material can vary depending upon the particular application. The material is plated with black nickel to enhance radiant heat transfer. The material should be plated after the openings 108 have been drilled or punched.

Figure 7:
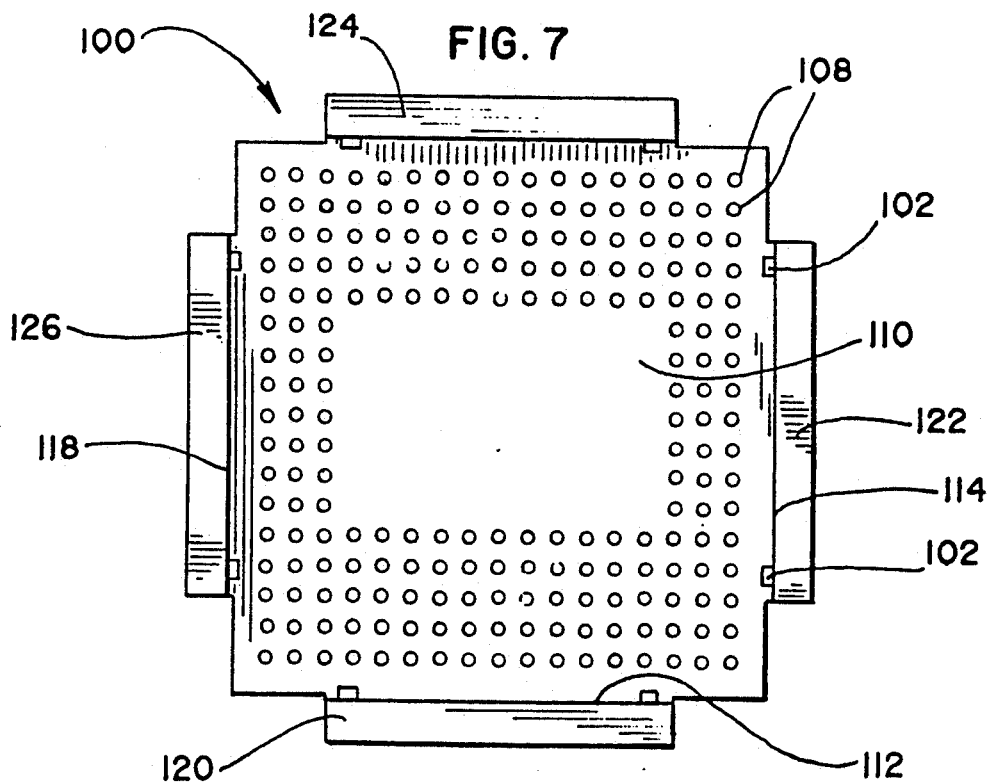
FIG. 7 is a top plan view of the thermal transfer plate of this invention.

Referring further to FIGS. 7 and 8, the thermal transfer plate 100 has a base portion 110 with upright side walls 112, 114, 116 and 118 which together form a socket that receives the IC package. In addition, the thermal transfer plate 100 fits inside the socket body 62. As noted above, the side walls can incorporate centering tabs 102 or can have openings 206 which will permit the tabs 204 of separate centering clips 202 to protrude through the openings 206.

The shape and configuration of the thermal transfer plate 100 may vary depending upon the electrical component and the application of the thermal transfer plate 100. For example, the thermal transfer plate 100 could have a base portion 110 and only one or two side walls 112. Similarly, the thermal transfer plate 100 could have a base portion 110 and no side walls. In this configuration, a section of the base portion would extend horizontally beyond the electrical component and socket. The cooling fins or heat dissipation means could then be incorporated into this extended section or a heat sink could be attached to this extended section of the base portion.

As shown in FIGS. 7 and 8, horizontal cooling fins 120, 122, 124 and 126 are located at the top of the sidewalls 112, 114, 116 and 118, respectively. The cooling fins 120, 122, 124 and 126 extend above the socket assembly 60 to facilitate dissipation of the heat to the surrounding air. Referring also to FIGS. 9 and 10, the cooling fins or heat dissipation means can be made into any shape which will perform the cooling or heat sink function. For example, in FIG. 9 the cooling fins 130 have an S-shaped cross-section which greatly increases the surface area of each fin and results in a greater cooling or heat sinking capacity. Furthermore, the cooling fins 130 have openings 132 which permit air to circulate through the cooling fins. These openings 132 can be of any shape or size which is suitable to perform the cooling function.

Another embodiment of the cooling fins is shown in FIG. 10. Here, the fins 140 are tabs which are alternatively directed upwards or downwards at approximately 20 degrees from the horizontal plane. As can be seen, the cooling fins can be made into any shape which will perform the cooling or heat sink function. By way of further example, additional vertical cooling fins or cooling columns may be attached to the upper surface of the fins to dissipate heat. Many heat sink or cooling fin configurations are well known in the art.

Moreover, due to its efficient heat transfer capabilities, the thermal transfer plate 100 could be thermally connected to a separate heat sink device or heat dissipation means. In this configuration, the thermal transfer plate 100 would act as a conduit to transfer heat from the IC package or electrical component to the heat sink device or heat dissipation means. A separate heat sink device may be necessary in order to achieve greater cooling capacity or in order to eliminate or reduce the size of the cooling fins due to dimensional limitations for the socket assembly.

Referring to FIGS. 5 and 6, a pliable thermal interface material 150 with good thermal conductivity is located between the IC package 12 and the thermal transfer plate 100. The thermal interface material 150 insures intimate contact with both of the opposed surfaces and improves the transfer of heat from the IC package 12 to the thermal transfer plate 100. Without the thermal interface material 150, the IC package 12 may only contact the thermal transfer plate 100 at a few points due to irregularities in the surfaces of the IC package and the thermal transfer plate. The thermal interface material 150 compensates for any such irregularities or voids between the surfaces and therefore assures that the heat from the IC package 12 is efficiently transferred to the thermal transfer plate 100. However, a thermal interface material 150 is not necessary in some uses of the thermal transfer plate 100 and accordingly, the thermal interface material can be eliminated from the socket assembly to minimize manufacturing costs.

Several different thermal interface materials could be used which are commercially available and well known in the art. For example, thermal interface material 150 could be a silicon based thermal compound marketed by EG&G Wakefield Engineering which is located in Wakefield, Mass., U.S.A. The thermal interface material 150 could also be a thermal transfer pad or film which is affixed to the thermal transfer plate 100. This thermal transfer film is marketed by Chomerics, Inc. of Hudson, N.H., U.S.A. under the tradename CHO-THERM. If the thermal interface material 150 is a pad or film, then the openings 108 in the thermal interface material 150 should be drilled or punched before the thermal interface material 150 is applied to the thermal transfer plate 100.

During operation of the electronic circuitry, the die generates heat and this heat can destroy the active elements in the die. In addition, heat can severely limit the speed and power capabilities of the circuitry in the die. Therefore, it is necessary to dissipate the heat generated by the die.

The thermal transfer plate 100 functions in the following manner to avoid such adverse results. The heat from the die is transferred to the copper/tungsten slug or other suitable material on which the die is located. The slug, which is located inside the ceramic substrate, has posts which project through the ceramic to the outside of the package to form thermal lands 15. The heat from the thermal lands and surrounding ceramic substrate is transferred to the thermal transfer plate 100 through the thermal interface material 150. The thermal transfer plate 100 then transfers the heat to the cooling fins or to a heat sink device where the heat will be dissipated. Tests have demonstrated less than 4 degrees Fahrenheit of temperature difference from the center of the thermal transfer plate 100 to the cooling fin of the transfer plate. From the center of the thermal transfer plate to the cooling fin, the distance is approximately 0.7 inches. Consequently, the thermal transfer plate 100 is extremely efficient in transferring heat away from the IC package or an electrical component.

Although the invention has been shown and described with an IC package which has lands or pads, this invention can be used with any IC package or electrical component regardless of whether the component is soldered to the PC board or inserted into a socket.

For example, the invention could be used with IC packages which have pins whereby the pins are inserted into wadded-wire buttons or soldered to the PC board. Furthermore, this invention can be used with IC packages which have the "cavity down" configuration. In these IC packages, the invention would dissipate heat from the ceramic and reduce or eliminate the need for a heat sink on the top of the device.

While specific embodiments of the invention have been shown and described, it will be understood, of course, that the invention is not limited thereto since modifications may be made and other embodiments of the principles of this invention will occur to those skilled in the art to which this invention pertains. Therefore, it is contemplated by the appended claims to cover any such modifications and other embodiments which incorporate the features of this invention within the true spirit and scope of the following claims.

What is claimed is:

1. A thermal transfer member for removing heat from the mounting side of an electrical component having a selected grid pattern of electrical contacts exposed on the mounting side thereof while the component is mounted in a recess of a receiving socket means, said transfer member being formed of heat conductive material and being of a configuration for placement within the receiving socket means and for receiving such an electrical component therein with a mounting side thereof disposed contiguous to said transfer member while said transfer member is sandwiched between the electrical component and the receiving socket means, said transfer member including an array of openings therethrough arranged in a pattern corresponding to the pattern of electrical contacts of the electrical component for passage of electrical conductors in physical and electrical contact with corresponding electrical contacts of such electrical component when such electrical component is mounted in said transfer member, said transfer member when mounted in the receiving socket means has at least a portion extending from such a receiving socket means for dissipation of heat conducted from such mounting side of such an electrical component mounted therein.

2. The invention as in claim 1 wherein said transfer member is in thermal communication with a heat sink device.

3. The invention as in claim 1 wherein said formed of a metal.

4. The invention as in claim 3 wherein said member is formed of a copper alloy.

5. The invention as in claim 1 wherein said transfer member includes a planar base portion.

6. The invention as in claim 1 wherein said transfer member has a base portion and at least one diverging surface.

7. The invention as in claim 6 wherein said diverging surface is a surface which is perpendicular to said base portion.

8. The invention as in claim 7 wherein said diverging surface includes a heat dissipation means.

9. The invention as in claim 8 wherein said heat dissipation means is a cooling fin.

10. The invention as in claim 8 wherein said heat dissipation means is a plurality of cooling fins.

11. The invention as in claim 1 wherein said transfer member includes means for centering such an electrical component.

12. The invention as in claim 11 wherein said centering means is integral with said transfer member.

13. The invention as in claim 1 wherein said heat conductive material has a radiant heat transfer coating.

14. The invention as in claim 1 wherein said transfer member is of a recessed socket configuration for receiving such an electrical component therein, said transfer member including a bottom wall and side walls, said bottom wall thermally coupled with the mounting side of such an electrical component.

15. An electrical component assembly comprising an electrical component including an array of electrical contacts on a mounting side thereof, receiving means for receiving said electrical component with at least a portion of the electrical component seated within the receiving means, and a heat transfer member formed of heat conductive material for removing heat from said component, said heat transfer member including a heat transfer surface being disposed between said electrical component and said receiving means in thermal communication with the mounting side of said electrical component and extending beyond said electrical component, said heat transfer member having an array of openings which register with said electrical contacts on the mounting side of the electrical component.

16. The invention as in claim 15 wherein said receiving means is a socket and said transfer member is of a recessed socket configuration, including a bottom wall and at least one side wall, for receiving such an electrical component therein with the mounting side thereof disposed contiguous to said bottom wall.

17. The invention as in claim 15 wherein said electrical component is an integrated circuit package.

18. The invention as in claim 15 wherein said electrical component has a thermal transfer area located on said mounting side thereof.

19. The invention as in claim 15 wherein said electrical component transmits thermal flow toward said mounting side thereof.

20. The invention as in claim 15 wherein said heat transfer member is in thermal communication with a heat sink device.

21. The invention as in claim 15 wherein said heat conductive material is a metal.

22. The invention as in claim 21 wherein said heat conductive material is a copper alloy.

23. The invention as in claim 15 wherein the portion of said heat transfer member extending between said mounting side of said electrical component and said receiving means is planar.

24. The invention as in claim 15 wherein said heat transfer member has a base portion.

25. The invention as in claim 24 wherein said base portion is planar.

26. The invention as in claim 15 wherein said heat transfer member has a base portion and at least one diverging surface.

27. The invention as in claim 26 wherein said diverging surface is a surface which is perpendicular to said base portion.

28. The invention as in claim 27 wherein said diverging surface is a heat dissipation means.

29. The invention as in claim 15 wherein said heat transfer member includes a heat dissipation means.

30. The invention as in claim 29 wherein said heat dissipation means includes a cooling fin.

31. The invention as in claim 15 wherein said receiving means includes centering means for centering said electrical component in said receiving means.

32. The invention as in claim 31 wherein said centering means is integral with said receiving means.

33. The invention as in claim 31 wherein said centering means is attached to said receiving means.

34. The invention as in claim 15 wherein said heat transfer member includes centering means for said electrical component.

35. The invention as in claim 34 wherein said centering means is integral with said heat transfer member.

36. The invention as in claim 35 wherein said centering means is at least one indentation in said heat transfer member.

37. The invention as in claim 34 wherein said centering means is attached to said heat transfer member.

38. The invention as in claim 15 wherein said heat transfer member conforms to said receiving means.

39. The invention as in claim 15 wherein said heat transfer member conforms to the mounting side of said electrical component.

40. The invention as in claim 15 wherein a thermal interference means is positioned between said transfer member and said electrical component.

41. The invention as in claim 40 wherein said thermal interface means in a thermal compound.

42. The invention as in claim 40 wherein said thermal interface means is a thermal transfer pad.

43. The invention as in claim 15 wherein said heat conductive material has a radiant heat transfer coating.

44. A thermal transfer member for removing heat from an electrical component while the component is mounted substantially within a recess of a receiving socket means with a mounting side including a plurality of electrical contacts facing inward in said recess, said transfer member being formed of heat conductive material and including a first heat transfer portion, said first portion being of an external configuration to be disposed in such a recess and forming an inner socket having an inner surface and being of an internal configuration to receive such a component therein with such mounting side of such a component in heat-transfer relation said inner surface of said first portion, said first portion including a plurality of apertures arranged in one-to-one correspondence with said plurality of electrical contacts, said member further including a second heat transfer portion extending from said first portion and of a configuration to extend out of such a receiving socket for conducting heat from such mounting side of such an electrical component mounted therein to said second portion for dissipation of heat externally of the socket means.

45. An electrical component assembly comprising an electrical component with multiple electrical contacts disposed on a mounting side thereof, socket means for receiving said electrical component to contain the profile of said electrical component within said socket means, and a heat transfer member formed of heat conductive material for removing heat from the mounting side of said component, said heat transfer member being disposed in said socket means between said electrical component and said socket means in thermal communication with the mounting side of the electrical component and extending beyond said electrical component, said heat transfer member including openings which register with the electrical contacts of said electrical component.

46. A thermal transfer member for removing heat from the mounting side of an electrical component while the component is mounted in a recess of a receiving socket means, said transfer member being formed of heat conductive material and being of a configuration for receiving such an electrical component therein with a mounting side thereof disposed contiguous to said transfer member, said transfer member including means for centering the electrical component integral with said transfer member with at least one spring tab, said transfer member including an array of openings therethrough for passage of electrical conductors in physical and electrical contact with such electrical component when such electrical component is mounted in said transfer member, said transfer member when mounted in the receiving socket means has at least a portion extending from such a receiving socket means for dissipation of heat conducted from such mounting side of such an electrical component mounted therein.

47. A thermal transfer member for removing heat from the mounting side of an electrical component while the component is mounted in a recess of a receiving socket means, said transfer member being formed of heat conductive material and being of a configuration for receiving such an electrical component therein and a mounting side thereof disposed contiguous to said transfer member, said transfer member including at least one indentation for centering the electrical component, said transfer member including an array of openings therethrough for passage of electrical conductors in physical and electrical contact with such electrical component when such electrical component is mounted in said transfer member, said transfer member when mounted in the receiving socket means has at least a portion extending from such a receiving socket means for dissipation of heat conducted from such mounting side of such an electrical component mounted therein.

48. An electrical component assembly comprising an electrical component including electrical contacts on a mounting side thereof, receiving means for receiving said electrical component including a spring tab integral with said receiving means for centering said electrical component in said receiving means, and a heat transfer member formed of heat conductive material for removing heat from said component, said heat transfer member being disposed between said electrical component and said receiving means in thermal communication with the mounting side of said electrical component and extending beyond said electrical component, said heat transfer member having openings which register with said electrical contacts on the electrical component.

49. An electrical component assembly comprising an electrical component including electrical contacts on a mounting side thereof, receiving means for receiving said electrical component including at least one spring clip attached to said receiving means for centering said electrical component in said receiving means, and a heat transfer member formed of heat conductive material for removing heat from said component, said heat transfer member being disposed between said electrical component and said receiving means in thermal communication with the mounting side of said electrical component and extending beyond said electrical component, said heat transfer member having openings which register with said electrical contacts on the electrical component.

50. An electrical component assembly comprising an electrical component including electrical contacts on a mounting side thereof, receiving means for receiving said electrical component, and a heat transfer member formed of heat conductive material for removing heat from said component, said heat transfer member being disposed between said electrical component and said receiving means in thermal communication with the mounting said of said electrical component and extending beyond said electrical component, said heat transfer member having openings which register with said electrical contacts on the electrical component and having at least one spring tab integral with said heat transfer member for centering said electrical component.

51. An electrical component assembly comprising an electrical component including electrical contacts on a mounting side thereof, receiving means for receiving said electrical component, and a heat transfer member formed of heat conductive material for removing heat from said component, said heat transfer member being disposed between said electrical component and said receiving means in thermal communication with the mounting side of said electrical component and extending beyond said electrical component, said heat transfer member having openings which register with said electrical contacts on the electrical component and having at least one spring clip attached to said heat transfer member for centering said electrical component.

* * * * *

UNITED STATES PATENT AND TRADEMARK OFFICE
CERTIFICATE OF CORRECTION

PATENT NO. : 5,282,111
DATED : Jan. 25, 1994
INVENTOR(S) : Albert N. Hopfer

Figure 14:
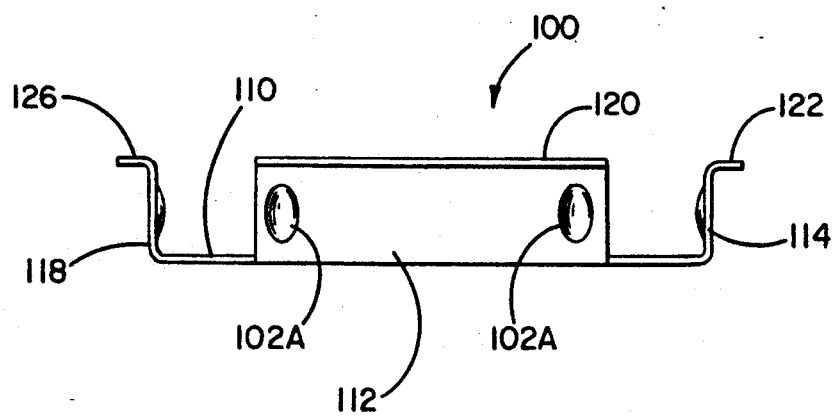
FIG. 14 is a side elevational view of another embodiment of the thermal transfer plate.

It is certified that error appears in the above-indentified patent and that said Letters Patent is hereby corrected as shown below:

Column 5, line 65, delete "FIG. 4" and substitute therefor --FIG. 14--

Column 8, line 4, delete "button" and insert --buttons--.

Column 8, line 60, delete "contacts" and insert --contact--.

IN THE CLAIMS:

Claim 3, Column 11, line 47, after "said" insert --member is--

Claim 47, Column 14, line 25, delete "and" and substitute therefor --with--.

Claim 50, Column 15, line 7, delete "said" and substitute therefor --side--.

Signed and Sealed this

Sixth Day of September, 1994

Attest:

BRUCE LEHMAN

*Attesting Officer*     *Commissioner of Patents and Trademarks*